(12) United States Patent
Yamamoto et al.

(10) Patent No.: US 6,228,181 B1
(45) Date of Patent: *May 8, 2001

(54) MAKING EPITAXIAL SEMICONDUCTOR DEVICE

(76) Inventors: Shigeo Yamamoto, 7-20, Higashikagankita 5-chome, Chigasaki-shi, Kanagawa (JP), 253-0053; Mitsuhiro Maruyama, 44-29, Wada 1 chome, Suginami-ku, Tokyo (JP), 166-0012

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/161,494

(22) Filed: Sep. 28, 1998

(30) Foreign Application Priority Data

Oct. 2, 1997 (JP) .................................................... 9-270086
May 8, 1998 (JP) .................................................. 10-126504

(51) Int. Cl.[7] .................................................... H01L 29/06
(52) U.S. Cl. ............................ 148/33.5; 438/48; 438/492; 438/495; 438/496; 438/497; 438/500; 438/501; 438/503

(58) Field of Search ..................... 438/535, 48, 492–503; 219/121.6; 313/525, 495, 106; 264/400; 252/193; 148/33.5

(56) References Cited

U.S. PATENT DOCUMENTS

| | | | | |
|---|---|---|---|---|
| 5,034,068 | * | 2/1990 | Glenn ..................................... | 136/256 |
| 5,417,770 | * | 5/1995 | Saitoh et al. .......................... | 136/258 |
| 5,639,314 | * | 6/1997 | Kura et al. ............................ | 136/244 |
| 5,644,156 | * | 7/1997 | Suzuki et al. ......................... | 257/485 |
| 5,885,725 | * | 3/1999 | Toyama et al. ........................... | 429/9 |
| 5,913,986 | * | 6/1999 | Matsuyama ........................... | 136/255 |

* cited by examiner

Primary Examiner—Matthew Smith
Assistant Examiner—Granvill Lee
(74) Attorney, Agent, or Firm—Kanesaka & Takeuchi

(57) ABSTRACT

An epitaxial semiconductor wafer characterized by making the P-N junction face which having either flat or uneven face in a manner of uniformed thickness from the top surface, due to making a P or N type first layer by the Chemical Vapor Deposition on the basic plate and also to making a N or P type secondary layer on said first layer, while both of the layers being highly and pure controlled silicon, and the light reflectors being located at the out side of said each P or N type layer for concentrating the incoming light to the P-N junction portion.

2 Claims, 4 Drawing Sheets

MAKING EPITAXIAL SEMICONDUCTOR DEVICE

BACKGROUND OF THE INVENTION

1. Field of the Invention

This invention is the most applicable to the solar cell(s) which being formed by the semiconductor layers having the different conductive type as well as the different specific resistance by making a structure of catching the incoming light to the P-N junction portion which being formalized by either in flat form or in uneven form, and also by making the wafer which being formed by an epitaxial growth a cheaper fabrication cost.

2. Description of the Related Art

The semiconductor wafer on which many devices as transistors ICs and others being formed should be highly and purely controlled in wafer itself. It has usually 100 Ωcm through several hundreds Ωcm in his specific resistance (Semiconductor Grade Silicon-SG—Si).

It has also the necessity of mirror polishing on its semiconductor plate which being formed in high pure crystal level when it is formed the transistor(s) and other active circuits in it, then, a semiconductor circuits are usually formed within 5 µm from its mirror surface by either a diffusion method or an epitaxial method when an epitaxial growth can be made by P or N type semiconductor layer within several µm in its thickness.

Followings are the reasons why a mirror polishing being necessity on the semiconductor wafer surface.

(1) If the distance from the P-N junction face to the bottom of the diffusion circuit(s) being not kept in constant, the total junction capacities which being consisting of the P-N junction depletiation layer's capacity and the diffusion portion's capacity, and the circuit fixed time constants shall be changed due to the impurity distribution's non-uniformity at the P-N junction portion. this can not be enabled a hopeful circuit construction.

(2) A circuit can not work as well as of scheduled due to non constant value in the capacitance and in the resistance because there are existing of unwilling uneven on P-N junction portion.

Due to the above two defects, this will not be impracticable because the electricity which being generated at the P-N junction portion shall be changed to a heat in its wafer instead of giving it to the outside circuit.

According to the above reasons, there should be keep constant the scope of impurity contents (N type or P type impurity contents) as well as the oxygen contents in the semiconductor wafer.

For example, in the pulling upped crystal by Czochoralski Method (CZ- method), each about 15% of its head portion and bottom portion of the crystal body shall be removed for only using an uniformed impurity contents parts.

Then the above remaining 15% portions are usually used as for solar cell(s), for reproduction crystal or for high power transistors.

Further, The portion of using as a semiconductor wafer in the pulled up crystal shall be sliced by a diamond cutter or a wire saw to have been 0.5–1.0 mm in their wafer thickness.

The essential problem in this respect is that each wafer's production cost should be extremely high like of the diamond, because of the utility ratio of this high purity semiconductor crystal being about 50% of the total body due to produce the semiconductor wafer by sliced in a preliminary thickness upon preliminary removing of the head and tail portions in which a rather higher impurity contents being to be included.

There is also a defect of having a trend of worse along the outside toward in its impurity contents ratio while its diameter shall be enlarged by and by. This phenomenon may bring some change in a circuit constant value and there have some limitation to the crystal diameter at the fabrication of IC wafer.

There is also a fear of falling down of the pull-upped crystal which having 100 Kg or more in its weight. Therefore, there is a limitation to pull-up the crystal which being usually less than 100 Kg in its weight.

As the fourth essential point, the wafer production cost should be much higher as well, due to the more awkward production process, upon the necessity of the wafer surface mirror polishing for keeping the wafer flatness by µm order.

This means that the result of making the mirror polishing on the wafer surface leads to be necessary attached the inspection process of examining whether the mirror polished surface shall be in the scope of the allowance in order, upon the necessity of the expensive wafer polishing machine.

But, it is an only area to several µm from the surface of the semiconductor wafer that the necessity portion for making a devices as transistor circuits and others in the wafer as mentioned in the above (1) and (2). There is not so necessary portions in other portions which being lower than the portion from above several µm in its depth to the bottom of the wafer for making a devices as transistor circuits, but it is only used for supporting the upper above active portions.

This means that there is no necessity of considering for using such high cost as well as high purity semiconductor wafer until such supporting portions. On the other hand, there is an enough potion for manufacturing a solar cell(s) for considering a high impurity area in only several µm in wafer's thickness, and other portions than the above should not be necessary to consider its purification at all.

As other essential points for manufacturing the solar cell(s) by a semiconductor wafer, there is the necessity of more higher Light to Electricity transfer effect in its solar cell(s).

Following two points are essentials for obtain it;

a) Effective enlargement of the P-N junction layer.

b) Light transparent amounts at the P-N junction portion should be grown.

SUMMARY OF THE INVENTION

The first object of this invention is of making up the substantial Light-Electricity transfer effect of the solar cell(s) while the solar cell(s) production costs shall be kept at lower level as possible due to no making any critical mirror polishing on the surface of its semiconductor wafer, and making up-grade of the yield of the cell(s) while such semiconductor wafer standards as in flat level degree, in impurity distribution degree, in crystal defects degree and etc., as well as due to enlarge the P-N junction portion by making the fine uneven at its portion, The second object of this invention is of making up the substantial Light-Electricity transfer effect of the solar cell(s) for making the incoming light's transparent numbers growth at the portion of P-N junction surface at which Light-Electricity transfer being made by fabricating the light reflection surface at both outsides of such P-N junction face, while the junction face between the semiconductor plate portion (for example PH) and the CVD layer (for example P+) at the semiconductor basic plate shall also working as the light reflector due to different of the resistances at both sides.

Then the light reflector is covered on the upper N(or P)layer at the P-N junction portion.

This is to say that as shown in FIG. 3, the sun light shall penetrate the upper light reflection layer, and further penetrate the P-N junction portion at about 80% of it while 20% of the light energy shall be transferred to the electricity at the portion of said P-N junction portion. Then, said penetrated 80% light energy shall attain the second light reflection surface. At the reflection surface around 40% of said penetrated 80% light energy shall be reflected. Then it penetrate through such P-N junction portion again, meanwhile 20% of such penetrating light energy (around 6% or so of the first incoming light energy) shall be transferred into the electricity. Further penetrating light energy shall attain the upper reflection layer, then, reflect again toward to said P-N junction.

At this time, generally speaking, P++:0.01 Ωcm or less in the specific resistance, and P+: 0.02–5.00 Ωcm in the specific resistance.

As mentioning above, there is designed in this structure of the incoming light shall penetrate through P-N junction portion with several times, the Light-Electricity transfer effect shall elevate to be 30% or so. This situation will be similar to a signal transmission in the optical fiber in optical communication field in which a light signal will transfer toward to its line direction.

It has also a big merit of receiving a favor in the semiconductor manufacturing process under a rigid production control in the semiconductor structure level. This means a perpetual usable industrial products which being the same as general semiconductor devices as far as it will not have been received any damage from the outside field.

As were combined the above two merit due to the multiplication effects in the solar cell(s) semiconductor wafer, the Light-Electricity transfer effect shall be enormously increased.

According to one aspect of the invention there is provided an epitaxial semiconductor wafer characterized by making the surface of the metal silicon plate having a tiny uneven portions surface in a manner of uniformity, and making a P or N type first layer which being made by either a crystal or an amorphous semiconductor consisting of a highly and pure controlled silicon by a Chemical Vapor Deposition on its surface, then, making a N or P type secondary layer which being by either a crystal or an amorphous semiconductor consisting of a highly and pure controlled silicon in a manner of the counter conductive type.

Due to two epitxialized layers by P (or N) semiconductor layer and N (or P) semiconductor layer being on the metal silicon basic plate which being made the uneven portions surface in a manner of uniformity on the surface thereof, the distance between P-N junction face and the top of the epitaxial semiconductor wafer shall be kept at a constant value. According to this merit, there will be made the epitaxial semiconductor wafer which having a stable circuit being equality in each capacity's value as well as in each resistance value.

There is no consideration of the impurity in the basic plate of the epitaxial semiconductor wafer in this invention, and this is the essential difference point from the prior art.

There is neither need of the distinct mirror polishing of the surface of the metal silicon which being to be a wafer's substrate. According to the above, we can obtain the highest production yield for the semiconductor wafer while even it being of the lowest cost in its wafer production.

Due to having the fine controlled uneven on the epitaxial semiconductor wafer, a more than 50% upped P-N junction area than those of the flat P-N junction area. This has more higher Light-Electricity transfer effect in together with the essential growth of the light which is transpiring the P-N junction portion in the wafer as above mentioning.

According to another aspect of the invention there is provided an epitaxial semiconductor wafer characterized by making the surface of the insulator plate having uneven portions in a manner of uniformity, and making a P or N type first layer which being made by either a crystal or an amorphous semiconductor in existing a highly and pure controlled silicon due to a Chemical Vapor Deposition on its surface, then, making a N or P type secondary layer which being by either a crystal or an amorphous semiconductor in existing a highly and pure controlled silicon in a manner of the counter conductive type.

According to this construction, we shall make the epitaxial semiconductor wafer in the extremely low cost because of being to be made the conductive plate as a conductive glass plate, a conductive ceramic plate and a conductive heatproof plastic as a wafer basic plate.

According to this manner, the investment cost shall be reduced because of no need of preparing any expensive machine to produce the metal silicon, as well as the operation cost shall also reduced because of no need of any expensive fee for maintaining them upon well working condition.

According to still another aspect of the invention there is provided an epitaxial semiconductor wafer characterized by making the surface of the flat metal silicon plate, and making a P or N type first layer which being made by either a crystal or an amorphous semiconductor in existing a highly and pure controlled silicon due to a Chemical Vapor Deposition on its surface, then, making uneven portions in a manner of uniformity on its P or N type Chemical Vapor Depositioned surface, then, making a N or P type layer which being by either a crystal or an amorphous semiconductor in existing a highly and pure controlled silicon in a manner of the counter conductive type.

By making the first epitaxial layer due to a Chemical Vapor Deposition by either P type or N type or Amorphous semiconductors, and making a fine controlled uneven on its first Chemical Vapor Deposition layer, and then, making a N or P type secondary layer which being by either a crystal or an amorphous semiconductor in existing a highly and pure controlled silicon in a manner of the counter conductive type on said uneven first layer, through either Chemical Vapor Deposition, or through a Diffusion manner, or through Ion-Implantation, we can obtain an stable valued capacitor as well as very stable circuits on the epitaxial semiconductor wafer. Due to the above form, we can find that there is no need of considering for maintain any high and pure controlled basic semiconductor plate. This can be made an increased yield while it keeps the essential low cost.

Due to having the fine controlled uneven on the epitaxial semiconductor wafer, a more than 50% upped P-N junction area than those of the flat P-N junction area. This has more higher Light-Electricity transfer effect by accompanying of the essential growth of the light which is transparing the P-N junction portion in the wafer as above mentioning.

According to yet another aspect of the invention there is provided an epitaxial semiconductor wafer characterized by making the surface of the flat conductor plate, and making a P or N type first layer which being made by either a crystal or an amorphous semiconductor in existing a highly and pure controlled silicon due to a Chemical Vapor Deposition on its surface, then, making uneven in a manner of uniformity on its P or N type first layer, then, making a N or P type secondary layer which being by either a crystal or an amorphous semiconductor in existing a highly and pure controlled silicon in a manner of the counter conductive type.

According to this construction, there is no consideration of impurity in the basic plate of the epitaxial semiconductor wafer in this invention. There is neither need of the distinct mirror polishing of the surface of the insulator which being to be a wafer's substrate.

According to another aspect of the invention there is provided an epitaxial semiconductor wafer characterized by making the semiconductor layers which having the different conductivities and/or the specific resistances on the basic plate surface, and making the first light reflection surface between said basic plate surface and the Chemical Vapor Deposition semiconductor layer which being made by a P or N type first layer by either a crystal or an amorphous semiconductor in existing a highly and pure controlled silicon due to a Chemical Vapor Deposition, then, making the second light reflection surface between the second semiconductor layer which having the counter conductive type N or P type second layer by either a crystal or an amorphous semiconductor which being located on said first layer and the light reflection layer which being located on said second semiconductor layer.

According to still another aspect of the invention there is provided an epitaxial semiconductor wafer of the claims (1) through (4) characterized by making the first light reflection layer which being located under the P-N junction surface, and making the second light reflection layer which being located more above than said P-N junction surface due to penetrate the incoming light and reflect the reflected light from said first light reflection layer toward said fist light reflection layer.

According to the invention, the light-electricity transfer effect shall be increased by sandwiching the light around P-N junction portion which being between the upper reflection layer and the lower reflection face.

This means the solar light into the solar cell(s) can be caught in the solar cell(s) while it shall be reflecting by the upper and the lower light reflectors in between P-N junction portion being existing, then, the transfer effect shall be increased.

According to the invention, the Light-Electricity transfer effect shall be enormously increased by the combination of (a) catching the sun light in the P-N junction portion in the epitaxial semiconductor wafer under the upper and the lower light reflection layers and (b) enlarging the P-N junction surface by making many fine uneven on its surface.

According to this invention, we shall have the extremely low cost epitaxial semiconductor wafer due to no consideration of the wafer substrate material.

Together with the above, the substantial large area against the sun can be obtained, if there will be made the fine uneven in the epitaxial semiconductor wafer, and therefore, the Light-Electricity transfer effect shall increase enormously than those of the prior arts.

DESCRIPTION OF THE PREFERRED EMBODIMENTS (a) through (d) in FIGS. (1) and (e) through (h) in FIGS. (2), are showing in cross section of the forming process for the epitaxial semiconductor wafer in which around 98% metal silicon basic plate being used.

Primary, the metal silicon manufacturing method for making the metal silicon plate is starting.

Metal grade silicon(MG—Si) is usually taken out into a collecting pan through a mixing process of the silicon stones in which there being rather small quantity of Copper, Iron, Aluminum and others, and the carbon materials such as oil, cokes and woods in a rotative electrical furnace by carbon ark diffusion method.

For getting 1 ton metal silicon, 2.5–2.7 tons silicon stones as well as 0.6 tons woods and 0.6–0.7 tons the mixture of coals, oil and cokes, and 0.3–0.5 wood chips.

As an example, the metal silicon (MG—Si) which contents being about 98% or so taken out in the collecting pan is going to be made an either mono-crystal or poly-crystal wafer after some impurity being added by way of a rotation centrifugal force of a dripped melted metal silicon, such as the Boron for making a higher conductivity.

Or making an ingot due to the gradual solidalion method or the pulling up method after a quantity of the melted metal silicon pouring into a crucible, than, taken out a sliced out the semiconductor basic plate 1 by either the wire saw or the diamond cutter.

Figure 1A:
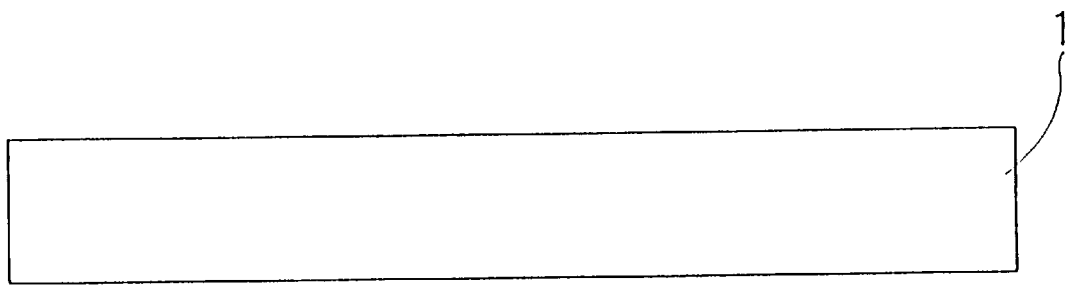
FIGS. 1(a)–(d) show a cross section drawing showing the prior half production process of the epitaxial semiconductor wafer in this invention.

Then out a sliced out basic plate 1 in 5 mm in their each thickness as well as in 180–500 mm in its diameter as shown in FIG. 1(a).

By the way, in case of using as a solar cell(s) it is enough that the thickness of the semiconductor basic plate shall be around 400 $\mu$m (0.4 mm) when of the specific resistance being 0.05–0.5 $\Omega$cm, and 600 $\mu$m (0.6 mm) around when of it being less than 0.05 $\Omega$cm, even though there is some different from the impurity density of said basic plate.

Further, the upper surface of the semiconductor basic plate shall be better of rough polishing for keeping some flatness but not mirror polishing being made.

Next, the uneven portions shall be made on the face of the semiconductor basic plate.

Figure 1B:
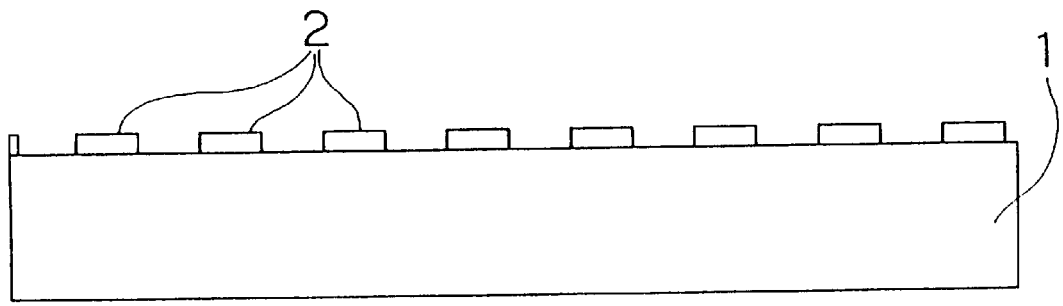
Figure 1C:
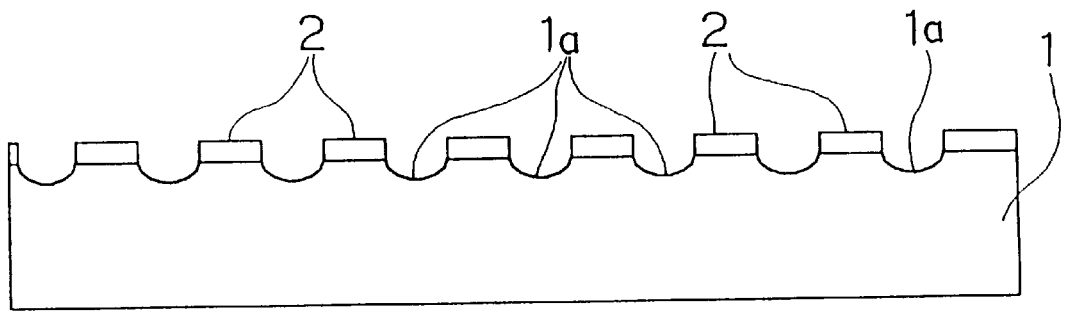
Figure 1D:
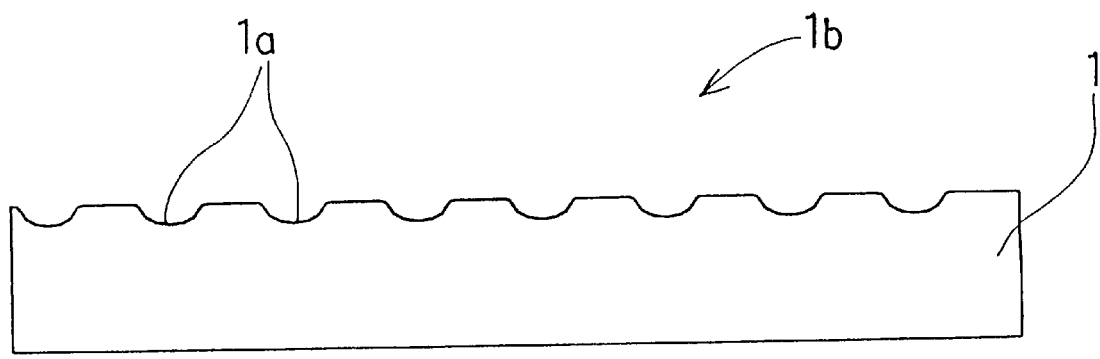

After taking out said semiconductor plate (1), there makes an mask (2) in which having fine holes upon as shown FIG. 1(b), then, making an uneven portion (1a) which being 2–3 $\mu$m in their thickness from the top surface of the plate as well as around 30 $\mu$m in its diameter (shown in FIG. 1(c)). By removing said mask (2), the wafer which having fine uneven on the semiconductor plate is appeared (shown in FIG. 1(d)).

By the way, the dent portion (1a) on the surface of the semiconductor basic plate shall be better for having 10–15 $\mu$m in their depth while the diameter of such dent being better for keeping around 30 $\mu$m.

Regarding the etching manner for making on the surface of said semiconductor basic plate the uneven portions, it is no problem for using a plasma etching method instead of using the wet etching as an example here.

Figure 2E:
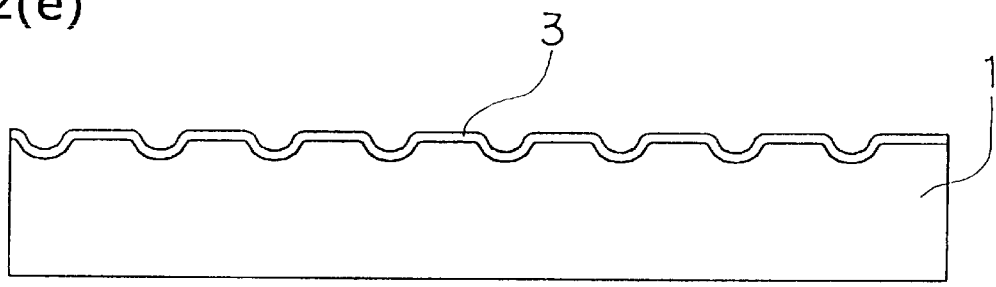
FIGS. 2(e)–(h) shows a cross section drawings showing the following half production process of the epitaxial semiconductor wafer in this invention.

Then, said semiconductor plate (1) which having uneven portions on its surface is putted into a Chemical Vapor Deposition device. There will be mounted a P type layer (3) which being included Boron as a impurity in its around 10 μm hopefully in less than 5 μm as shown FIG. 2(e).

According to this CVD method, the P+ layer due to Boron doping shall be mounted around 5 μm.

According to this CVD device, an epitaxial grown layer of poly-crystal or mono-crystal can be made due to either Mono-Silane (SiH4) or Tri-Chloro Silane (SiHC13) plus Hydrogen (H2) mixed gas under 800–1100° C.

Figure 2F:
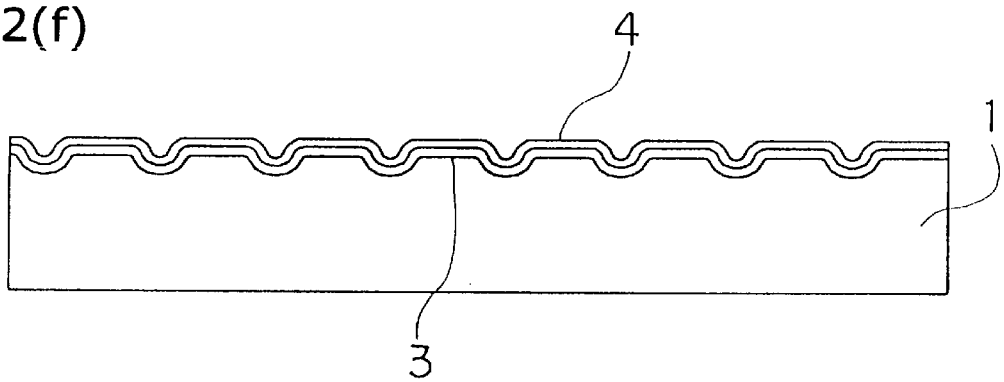

Then, N type epitaxial layer (4) which is a counter conductive type to said P type epitaxial layer (3) and containing such Phosphorus as an impurity in less than 10 μm and hopeful in around 3 μm in his thickness being stacked. The epitaxial semiconductor wafer (5) shall be established as shown FIG. 2(f).

By the way, the thickness of this N type epitaxial layer (4) including Phosphorus as an impurity shall be better in keeping less than several 10 μm, hopefully around 3 μm.

It is better for making Phosphorus (P) doping N layer having 3–5 μm in his thickness by the CVD method.

Figure 2G:
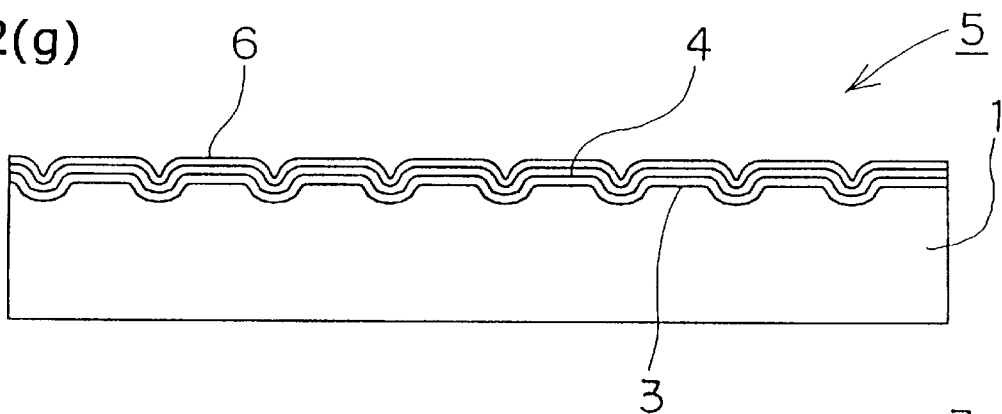

The reflection layer (6) shall be mounted on the N type layer (4) as shown in FIG. 2(g).

This layer (6) being made by Silicon-Nitride layer (Si3N4) or Silicon Dioxide (SiO2)layer.

The reflection layer shall be better for keeping 3–5 μm in its thickness.

Therefore, the reflection layer (6) shall work for catching the incoming solar light in the P-N junction portion which being between P type epitaxial layer (3) and N type epitaxial layer (4) by cooperation with the lower side reflection surface which has made in the basic plate.

According to the prior arts, the light absorption ratio at around P-N junction portion was less than 20% or so, then remaining 80% of the solar energy was absorbed in the basic wafer after penetrating P-N junction face, it being to be heat.

According to the present invention, the transfer effect shall be increased due to its penetration times through said P-N junction face being increased enormously.

At this time, there are two light reflection faces have born at each other side against the P-N junction portion. One is the junctioned face between the basic plate (1) (P++) and CVD layer 2 (P+), and the other being the upper reflection layer (6).

Both specific resistances of the semiconductor basic plate area (P++)and of the CVD layer (P+) are kept so as to be lower at basic plate and higher at CVD layer. According to the difference of such specific resistances the incoming light shall be reflected by the junction face of said two layers. For example, the specific resistance at P++ layer is usually 0.01 Ωcm or less, and P+ layer being 0.02–5 Ωcm.

Figure 3:
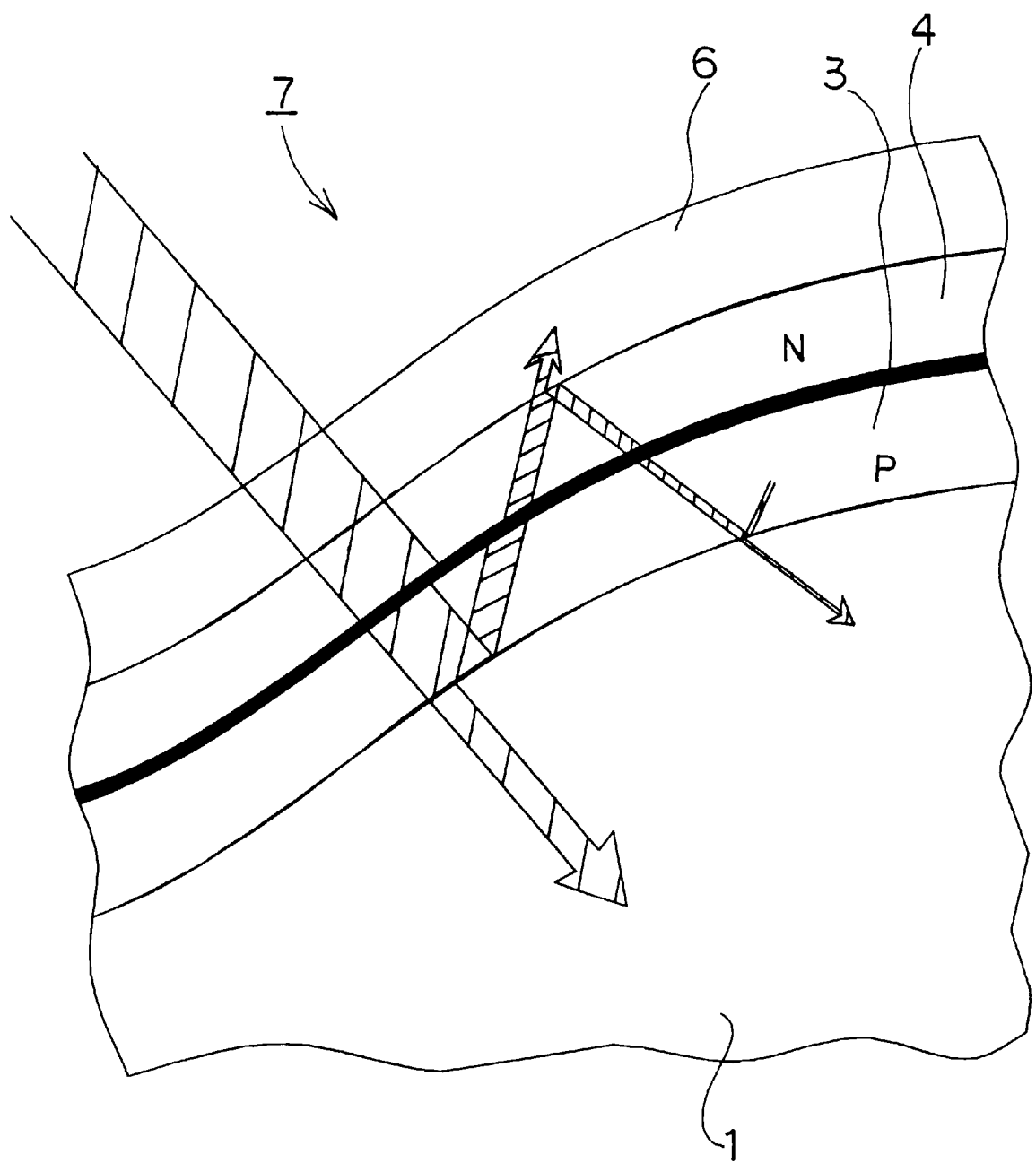
FIG. 3 shows is a practical enlargement explanation drawing particularly P-N junction portion in which some imaginary explanation regarding the incoming light and its reflection manner being included.

Therefor, as shown in FIG. 3 the incoming light into the semiconductor body shall be transferred to the electricity from photons at around 20% of it when it is penetrating through P-N junction portion, then, remaining 80% light energy are going to attain at the under reflection surface, and reflect towards P-N junction portion at around more than 50% of such penetrated amount of the light energy. 20% of such reflected light energy shall again penetrates P-N junction portion, then, remaining light energy shall attain to the upper light reflection layer, and reflecting again toward to the P-N junction portion, and etc.

According to the above the light energy shall be sandwiched in between said upper and down light reflectors, then, the photons thereof shall be changed to the electricity at the times of its penetrating through P-N junction portion. Then, total 30% or so of the incoming light energy shall be transferred into the electricity.

This structure shall also applicable to the wafer having flat P-N junction face, as well as to the wafer having a conductive basic plate as a supporter of it.

Figure 2H:
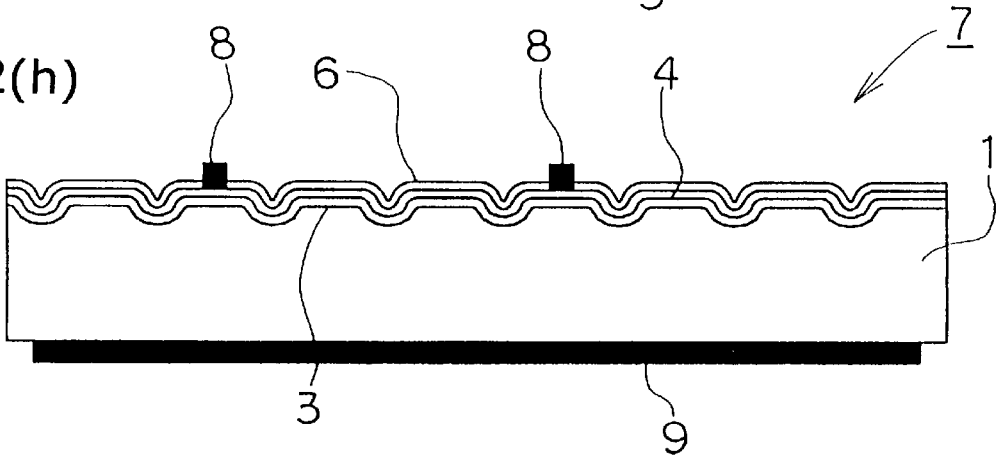

The contact plate as Aluminum plate shall be contacted directly to each P and N area when said light reflector (6) having been on it is removed partially beforehand along the mesh pattern. This is the completion of a solar cell(s) (7) which having 0.5–5 Ωcm in his specific resistance after the metallic contacts (Aluminum) (8),(9) were contacted to the N layer and the bottom of the basic plate respectively.(FIG. 2(h))

According to this construction, the high light-electricity transfer effected epitaxial semiconductor wafer in that the depth from the wafer surface to P-N junction face being kept in a fixed distance as well as there is no consideration of the purification at wafer's substrate, upon nothing of making any mirror polishing on the wafer. This means the cheapest cosseted while it is kept a higher transfer effected solar cell(s) can be obtained.

Further, there will be able to make an epitaxial semiconductor wafer on which surface there having an uneven portion, and that makes 65% upped P-N junction area than those of the mirror polished face on the wafer having a flat P-N junction as in the prior arts. Due to add the increasing effect of the generated electricity volume at the P-N junction portion by the reflected light.

This epitaxial semiconductor wafer shall have 20%–25% at one stroke in the light-electricity transfer effect than those of the prior arts 15%–18% even in the best numbers.

Further, two reflection faces in between the P-N junction area being located enable to increase the transfer effect when the above wafer being used as a solar sell(s)

This means, the reflection faces shall work for sandwiching the incoming solar light in the P-N junction portion in the solar sell(s), therefor, the transfer effect of the solar sell(s) shall increase so much.

Further, when the P-N junction portion having the fine uneven, the combination of (1) the enlargement of the transfer effect area and (2) the light catching effect shall increase the Light-Electricity transfer effect enormously.

FIG. 4(a)–(g) show other practical example regarding the formation process of this invention.

Figure 4A:
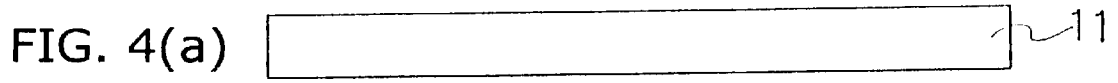
FIGS. 4(a)–(g) show other cross section drawings showing a production process of the epitaxial semiconductor wafer in this invention.
Figure 4B:
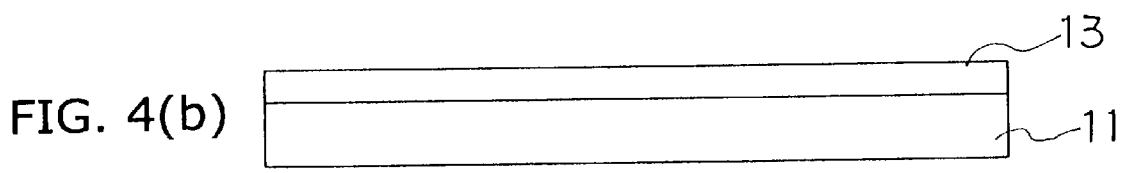

The semiconductor basic plate (11) is instantly put into the CVD device while it being kept a flat surface of its plate having less than 5 mm in its thickness as well as having 180–500 mm in its diameter as shown in FIG. 4(a). By this step, P type epitaxial layer (13) Boron as an impurity being included, and having 5 μm in his thickness. (FIG. 4(b)).

Figure 4C:
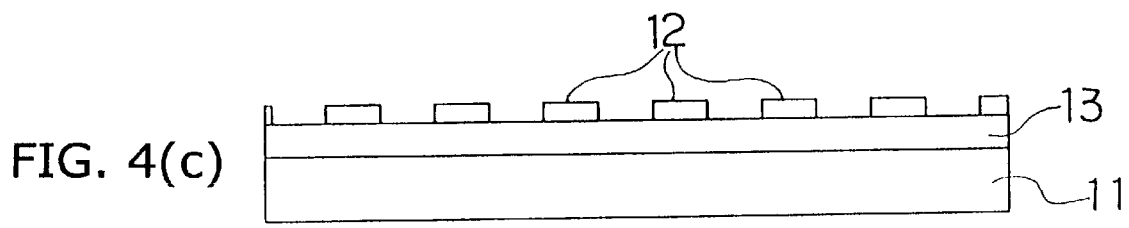
Figure 4D:
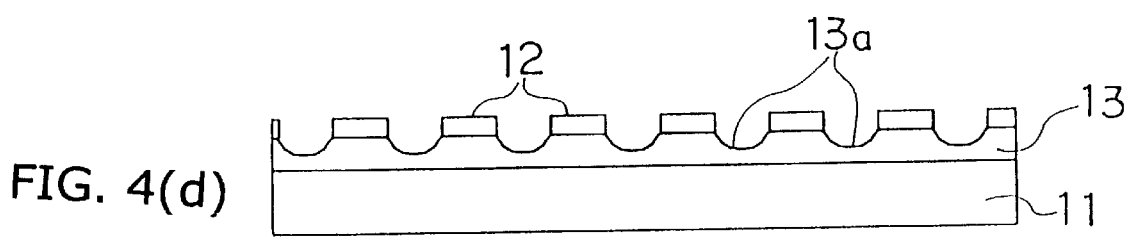

Then, A mask which has fine holes is covered on said P type layer (13) as shown in FIG. 4(c). A kind of ditches having several 10 μm in each diameter as well as 2–3 μm in the diameter from the surface of each hole of said mask (12) being made on said P type epitaxial layer (13) as shown in FIG. 4(d).

Figure 4E:
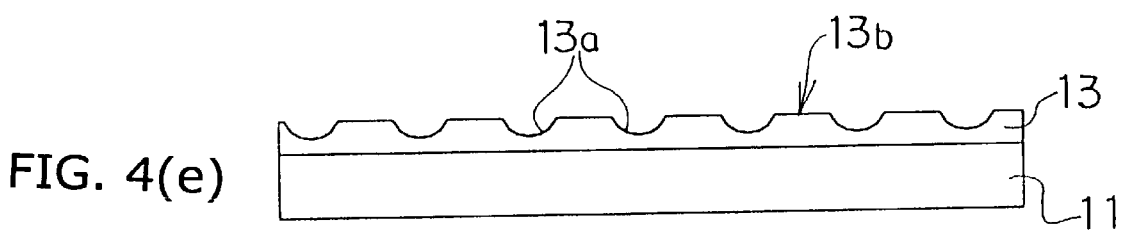

Thereafter, said mask (12) is removed by other etching liquid, there will be bone a fine uneven (13b) will have been appeared on P type layer (13) as shown in FIG. 4(e)

Figure 4F:
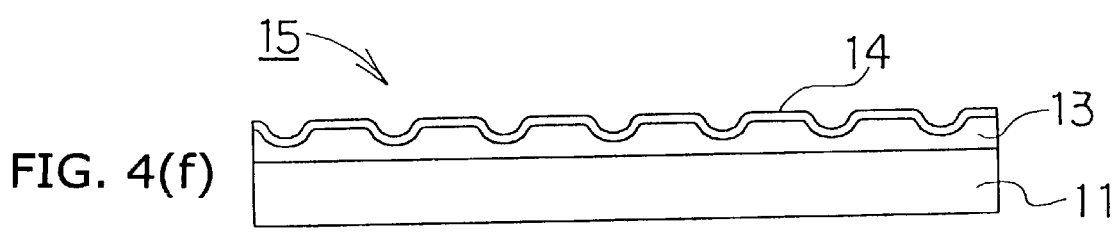
Figure 4G:
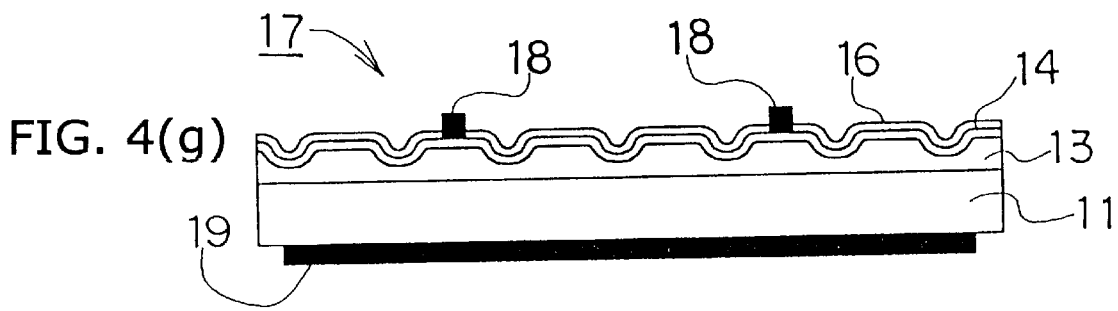

Again, said semiconductor plate (11) is putted into said CVD, for making another epitaxial layer (14) which having around 3 μm in his thickness and containing N type impurity such as Phosphorus, uniformly on said P type layer (13). This is a construction of the epitaxial semiconductor wafer (15) as shown in FIG. 4(f). By the way, it is no trouble that the layer (14) shall be made by a diffusion method or an ion-implantation method instead.

The contact plate as Aluminum plate shall be contacted directly to each P and N areas (11 and 14) when the light reflection layer (16) being on it being removed partially beforehand along the mesh pattern. This is a completion of a solar cell(s) (17) which having 0.5–5 Ωcm in his specific resistance after the metallic contacts (18) and (19) were contacted to the N layer (14) and the bottom of the basic plate 11 (P) respectively which is the same manner as above. (FIG. 4(g))

According to the above steps, there will be obtained the epitaxial semiconductor wafer which having a constant distance from P-N junction face to the wafer top, as well as having an uniformed capacitor and resister in its volume.

Further, according to make of an uneven portion in its P-N junctioned area and the generated electricity at its P-N junction portion due to the light reflection manner as mentioned before, the light-electricity transfer effect of the solar cell(s) shall be going up strictly as mentioned before.

In the above mentioning, we made examples of a metal silicon being the basic plate. However, it is also available for establishing the epitaxial semiconductor wafer that instead of the metal silicon, such as a conductive glass, a conductive ceramics or a conductive heatproof plastic is also available to a basic plate, and further, the uneven portions being made on it for making P-N junction area uneven. According to this structure, an enormous cost reduction will be realized.

This means, the non-metallic basic plate shall also be used as the epitaxial semiconductor wafer by epitaxing the well controlled P and N type layers on it.

According to this construction, we shall have the lowest investment cost because of no need of preparing any expensive machine to produce the metal silicon, as well as the lowest operation cost because of no need of any expensive fee for maintaining them upon well working condition.

As a practical example of CVD method, there will be able to manufacture poly-crystal layer as well as amorphous layer having 1–5 μm in its thickness due to flow a mixed gas as mono-silane (SiH4) and hydrogen (H2) under being in a low pressure while it being 300–400° C. in its atmosphere.

It is also available to built an epitaxial semiconductor wafer having a fine uneven top face that P or N type crystal or amorphous epitaxial layer being made on the insulator plate, then, a fine uneven being made on its epitaxial layer, then further, N or P type (which is counter conductive type) layer being stuck up thereabove.

There will be also available to make the further high transfer effect solar cell(s) by forming the light reflector layer on the top layer of the wafer, as well as by catching the light between the upper reflector and the lower reflector.

In this example, the Nitrogen-Silicon layer (Si3N4) or the Silicon-Di-oxide (SiO2) can be made on N type layer (14).

According to this invention, a defect conquest low cost epitaxial semiconductor wafer in which the distance from P-N junction face to the top face due to not necessary for making any mirror polishing on the basic plate as well as for making any high pure controlled mono-crystal as a basic plate being established.

And further, we will be able to make a far more area in the surface of the wafer as well as to make a far more increasing the electricity at P-N junction portion for enabling to increase the light-electricity transfer effect in solar cell(s). Due to this effect, we will be able to obtain 25% or so in its conversion ratio from 15% to 18% in the prior transfer effect grade.

Due to arranging the light reflectors so as to sandwich the P-N junction area, the light-electricity transfer effect of solar cell(s) shall increase enormously.

This means, the reflection faces shall work for sandwiching the incoming solar light in the P-N junction portion in the solar sell(s), therefor, the transfer effect of the solar cell(s) shall increase so much.

The combination of (1) the enlargement of the transfer effect area, and (2) the light catching effect shall increase the Light-Electricity transfer effect more than 25% D As mentioning above, according to one aspect of the invention there is provided an epitaxial semiconductor wafer characterized by making the surface of the metal silicon plate having fine uneven in a manner of uniformity, and making a P or N type first layer which being made by either a crystal or an amorphous semiconductor in existing a highly and pure controlled silicon due to a Chemical Vapor Deposition on its surface, then, making a N or P type secondary layer which being by either a crystal or an amorphous semiconductor in existing a highly and pure controlled silicon in a manner of the counter conductive type.

It will be able to make the epitaxial semiconductor wafer in which the P-N junction face being kept in the distance from the surface to said P-N junction face, due to making the fine uneven on the metal silicon basic plate, then making the first P(or N) type semiconductor layer and the second N(or P) type semiconductor layer one by one on said metal silicon basic plate. According to this, the epitaxial semiconductor wafer having the stable circuits of uniformed the capacities as well as the resistances can be obtained on it.

We can make an epitaxial semiconductor wafer attained the increased yield as well as the lowest manufacturing cost due to non consideration of the impurity of the basic plate, and non necessary of mirror polishing on the metal silicon plate which being to be a basic plate.

We will be able to submit the applicable solar cell(s) which has been increased the sun light-electricity transfer effect due to much wider P-N junction surface than those of prior mirror polished flat P-N junction.

According to this structure, there is no limitation for using the highly pure poly-crystal as a basic plate, but usable the much producible metal silicon as it. Therefore, the production cost of the epitaxial semiconductor wafer shall be extremely reducible.

According to still another aspect of the invention there is provided an epitaxial semiconductor wafer characterized by making the surface of the flat metal silicon plate, and making a P or N type first layer which being made by either a crystal or an amorphous semiconductor in existing a highly and pure controlled silicon due to a Chemical Vapor Deposition on its surface, then, making uneven portions in a manner of uniformity on its P or N type Chemical Vapor Depositioned surface, then, making a N or P type layer which being by either a crystal or an amorphous semiconductor in existing a highly and pure controlled silicon in a manner of the counter conductive type.

According to this invention, primary, there being made the flat metal silicon plate which having been made by either a crystal or an amorphous semiconductor in existing a highly and pure controlled silicon due to a Chemical Vapor Deposition on its surface, then making uneven portions in a manner of uniformity on its P or N type Chemical Vapor Deposition surface, then, making a N or P type layer which being by either the CVD or the Diffusion or the Ion-implantation method in existing a highly and pure controlled silicon in a manner of the counter conductive type N or P. It can be manufactured the epitaxial semiconductor wafer having a stable circuits due to obtaining the distance from the upper surface to the P-N junction face being kept in constant. The solar cell(s) shall have the increased yield as well as enormously reduced cost than those of prior high purification semiconductor using basic plate.

Also, there will be able to submit more higher transfer effected from the sun light to the electricity due to having the fine uneven portions.

According to yet another aspect of the invention there is provided an epitaxial semiconductor wafer characterized by making the surface of the flat insulator plate, and making a P or N type first layer which being made by either a crystal or an amorphous semiconductor in existing a highly and pure controlled silicon due to a Chemical Vapor Deposition on its surface, then, making uneven in a manner of uniformity on its P or N type first layer, then, making a N or P type secondary layer which being by either a crystal or an amorphous semiconductor in existing a highly and pure controlled silicon in a manner of the counter conductive type by either the CVD or the Diffusion or the Ion-implantation method.

According to another aspect of the invention there is provided an epitaxial semiconductor wafer characterized by making the semiconductor layers which having the different conductive types and/or the specific resistances on the basic plate surface, and making the first light reflection surface between said basic plate surface and the Chemical Vapor Deposition semiconductor layer which being made by a P or N type first layer by either a crystal or an amorphous semiconductor in existing a highly and pure controlled silicon due to a Chemical Vapor Deposition, then, making the second light reflection surface between the second semiconductor layer which having the counter conductive type N or P type second layer by either a crystal or an amorphous semiconductor which being located on said first layer and the light reflection layer which being located on the above of said second semiconductor layer, while the P-N junction which being made between said P layer and N layer keeping either in flat or uneven.

According to yet another aspect of the invention there is provided an epitaxial semiconductor wafer mentioning in above claims (1) through (4) characterized by making the first light reflection layer which being located under the P-N junction surface, and making the second light reflection layer which being located more above than said P-N junction surface due to penetrate the incoming light and reflect the reflected light from said first light reflection layer toward said first light reflection layer.

According to the invention the Light-Electricity transfer effect shall be increased by sandwiching the light around P-N junction portion which being between the upper reflection layer and the lower reflection face.

This means the solar light into the solar cell(s) can be caught in the solar cell(s) while it shall be reflecting by the upper and the lower light reflectors in between P-N junction portion being existing, then, the transfer effect shall be increased.

According to the invention the Light-Electricity transfer effect shall be enormously increased by the combination of (a) catching the sun light in the P-N junction portion in the epitaxial semiconductor wafer under the upper and the lower light reflection layers and (b) enlarging the P-N junction surface by making many fine uneven on its surface.

According to this invention, we can see how much the light-electricity transfer effect shall increase due to sandwiching the light by both upper and down light reflector. Also, we can see how much the light-electricity transfer effect shall be increase due to sandwiching the light by both upper and down light reflector and the uneven of P-N junction face.

According to the invention, there is no need of consideration of the pure ratio regarding the basic plate materials, and there is also no need for making a mirror polishing of the basic plate surface. While the stable circuits can be obtained due to enable to keep the uniformity of the capacity as well as the resistance in the wafer. Therefore, we shall obtain the lowest cost epitaxial semiconductor wafer. Further, we shall obtain the increased light-electricity transfer effected epitaxial semiconductor wafer because of the enlarged P-N junction face due to its uneven and the light sandwiching system by upper & down light reflectors when we compare with the prior arts.

What is claimed is:

1. An epitaxial silicon semiconductor wafer, comprising:
   a silicon substrate;
   a first crystal or amorphous silicon semiconductor layer of P or N type, which is provided on said silicon substrate by chemical vapor deposition and has a high degree of purity so that said first semiconductor layer has a specific resistance value two to five hundred times larger than that of said silicon substrate, thereby forming a first light reflecting face between said silicon substrate and said first semiconductor layer;
   a second crystal or amorphous semiconductor layer of an opposite type of said first semiconductor layer, which is provided on said first semiconductor layer and has a high degree of purity so that said second semiconductor layer has a specific resistance value two to five hundred times larger than that of said silicon substrate; and
   a second light reflecting face provided on said second semiconductor layer and made from a silicon insulator film, which allows incoming light to pass therethrough and sends back light reflected by said first light reflecting face, toward said first light reflecting face.

2. An epitaxial silicon semiconductor wafer according to claim 1, wherein a junction surface between said first and second semiconductor layers has fine unevenness.

* * * * *